United States Patent [19]
Wen et al.

[11] Patent Number: 5,821,629
[45] Date of Patent: Oct. 13, 1998

[54] BURIED STRUCTURE SRAM CELL AND METHODS FOR FABRICATION

[75] Inventors: Jemmy Wen; Joe Ko, both of Hsin-chu, Taiwan

[73] Assignee: United Microelectronics Corporation, Hsin-chu, Taiwan

[21] Appl. No.: 501,711

[22] Filed: Jul. 12, 1995

Related U.S. Application Data

[62] Division of Ser. No. 322,939, Oct. 4, 1994, Pat. No. 5,602,049.

[51] Int. Cl.$^6$ .................................................... H01L 27/11
[52] U.S. Cl. ........................ 257/903; 257/904; 257/382; 257/401
[58] Field of Search .................................. 257/903, 904, 257/382, 401, 400, 618

[56] References Cited

U.S. PATENT DOCUMENTS

| | | | |
|---|---|---|---|
| 5,166,763 | 11/1992 | Wada et al. | 257/903 |
| 5,258,635 | 11/1993 | Nitayama et al. | 257/904 |
| 5,324,973 | 6/1994 | Sivan | 257/903 |

*Primary Examiner*—Mark V. Prenty
*Attorney, Agent, or Firm*—Jeing & Chang

[57] ABSTRACT

An improved SRAM cell having ultra-high density and methods for fabrication are described. Each SRAM cell, according to the present invention, has its own buried structure, including word lines (i.e., gate regions) and bit lines (i.e., source/drain regions), thus increasing the cell ratio of channel width of cell transistor to that of pass transistor to keep the data stored in the cell transistor more stable without increasing the area per cell. In addition, according to the present invention, the field isolation between active regions is not field oxide but blankly ion-implanted silicon substrate. Therefore, SRAM cells can be densely integrated due to the absence of bird's beak encroachment. Since the present invention has more planar topography than the prior art, it is easily adapted to the VLSI process, which is always restricted by the limit of resolution of photolithography, thus increasing the degree of integration.

4 Claims, 4 Drawing Sheets

BURIED STRUCTURE SRAM CELL AND METHODS FOR FABRICATION

CROSS-REFERENCE TO RELATED APPLICATION

This invention is a divisional application of an earlier application filed on Oct. 4, 1994, having a Ser. No. 08/322,939, now U.S. Pat. No. 5,602,049.

BACKGROUND OF THE INVENTION

As indicated in FIG. 1, a 4T SRAM cell comprises two pass transistors 1, two cell transistors 2 and a poly-load 3. In order to keep the data stored in the cell transistors 2 more stable, it is always needed to raise the ratio of a channel width of the cell transistors to that of the pass transistors (it is briefly called "cell ratio", hereafter). For example, a process of fabricating a 64k CMOS SRAM will be briefly described below. After the formation of a P well 121 and the implantation of an Vt-adjusted ion, the growth of a field oxide 24 proceeds with the formation of a N well 20 simultaneously, as indicated in FIG. 2A. Then, it is sequentially preformed to grow a gate oxide 321 by thermal oxidation, to form a buried contact 51, and to deposit a first polycrystalline silicon layer 21 which fills said buried contact 51. The impurity-doped first polycrystalline silicon layer 21 is, in turn, subject to photoing and etching to form a gate of a MOSFET, as indicated in FIG. 2B. Subsequently, $N^+/P^+$ source/drain regions are traditionally formed by ion implantation. Over an entire exposed surface, an inter-poly dielectric layer 61 is deposited and vias 31 are, in turn, formed by photoing and etching. Thereafter, a second polycrystalline silicon layer is deposited and subject to photoing and etching to form a poly-load resistor 4. Finally, a Boro-Phosphosilicate Glass (BPSG) 8 is deposited, as indicated in FIG. 2C. The remaining processes are standard back-end CMOS processes, which include the formation of a contact window, the patterning and etching of a metal layer, and a passivation layer respectively etc.

As MOSFET devices are scaled to submicrometer dimension, their size will become very small and make channel length and width shrink. Thus, it results in a low punch-through voltage, threshold-voltage shift, leakage current, etc. Furthermore, it will be more serious in SRAM cells because it is always necessary to reduce the channel width of the pass transistors for the purpose of raising the cell ratio of SRAM cells. So, the prior art can't raise the cell ratio without deteriorating its electrical characteristics. In addition, the prior art, as shown in FIG. 2C, has a more complex topography; thereby, the devices can't be more densely packed due to the limited resolution of photolithography. Besides, the prior art used a field oxide between active regions which caused extra expenditure of the chip area due to bird's beak encroachment. Therefore, there is an apparent need to provide a method of raising the cell ratio without increasing the area per cell.

SUMMARY OF INVENTION

Therefore, an object of the invention is to provide a buried structure SRAM cell and methods for fabrication which have a higher cell ratio without needing extra area, thereby increasing the integration degree. Another object of the invention is to provide a buried structure SRAM cell and methods for fabrication; therein the channel width of a MOSFET can be controlled without increasing the area per cell.

One more object of the invention is to provide a fieldless buried structure SRAM cell and methods for fabrication which make the SRAM cell additionally packed.

A further objective of the invention is to provide a buried structure SRAM cell and methods for fabrication having more planar topography, which also adds to the overall cell density.

Each SRAM cell according to the present invention has its own buried structure including word lines (i.e. gate regions) and bit lines (i.e. source/drain regions), thus increasing the ratio of a channel width of the cell transistors to that of the pass transistors to keep the data stored in the cell transistors more stable without increasing the area per cell. In addition, according to the present invention, the field isolation between active regions is not a field oxide but blankly an ion-implanted silicon substrate, so the SRAM cell can be integrated with a high density due to the absence of bird's beak encroachment. Since the SRAM cell of the present invention has more planar topography than that of the prior art, it is easily adapted to an VLSI process which is always restricted by the limited resolution of photolithography, thus increasing the degree of integration.

BRIEF DESCRIPTION OF THE DRAWINGS

The invention itself, however, as well as other features and advantages thereof, will be best understood by reference to the detailed description which follows, read in conjunction with the accompanying drawings, wherein.

DESCRIPTION OF THE PREFERRED EMBODIMENT

Although the operating principle and the fabricating process of DRAM cells are quite different to that of SRAM cells, there are some similarities between theses two devices. For example, in order to reduce the area per call and yet maintain the capacitance of a capacitor, most commercial DRAM cells have three dimensional trenched capacitors. A wide range of capacitor-trenched DRAM cells has been proposed; such as, see Baglee, et al., U.S. Pat. No. 4,271,987, "Trench Capacitor Process for High Density Dynamic RAM", issued Jan. 26, 1988. Similarly, the principle goal of the invention is to raise the cell ratio (it is defined in the beginning of this article) without needing extra area occupied by the cells, thus, a buried-gate MOSFET structure is now described by the present invention. Besides, for the purpose of reducing a junction depth, a buried poly-filled bit line structure is also proposed to substitute a conventional diffusion structure.

Figure 3A:
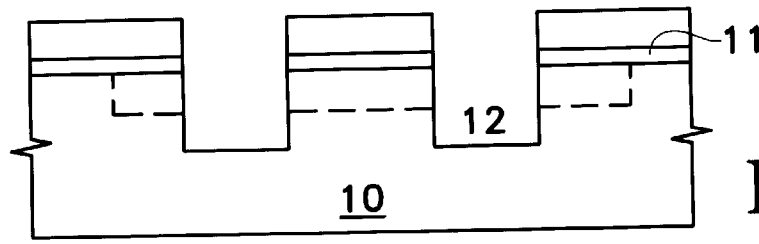
FIG. 3A through 3J are schematic cross-sectional views of several crucial steps according to the present invention.

A process for fabricating the buried structure SRAM cells is disclosed. First of all, referring to FIG. 3A, a well (indicated by dashed line) of a predetermined conductivity type (i.e. N Type or P Type) is first formed on a silicon substrate 10. Then, the entire substrate 10 is subject to a thermal oxidation cycle to grow a pad oxide 11 to a thickness of approximately 800 Angstroms. A layer of photoresist is then patterned and the pad oxide 11 is etched to provide source/drain trenches 12 by anisotropic etching to a depth of 1–5, μm. This anisotropic etching may be accomplished by a suitable plasma source of etchants and ions. After the removal of the photoresist, walls of the source/drain trenches 12 are then doped with arsenic for a N well or Boron for a P well to raise a punch-through voltage between the bit lines using one of many processes (not shown in FIG. 3A). For example, an angled ion implantation with impurity ions at an angle of 8° while rotating the substrate 10 may be performed. Other suitable doping techniques such as deposition of doped materials and diffusion of dopants into the substrate may suitably be used. The walls of the source/drain trenches 12 plus the silicon substrate between the source/drain trenches 12 doped simultaneously are used to replace the field oxide for the field isolation of active regions. Consequently, there is no bird's beak encroachment problem in the invention, resulting in increasing of the cell density. The entire substrate 10 is subsequently subject to a thermal cycle to grow a silicon dioxide layer at the walls of the source/drain trenches 12 to a thickness of approximately 100 to 600 Angstroms, which should be thinner than the pad oxide 11.

Figure 3B:
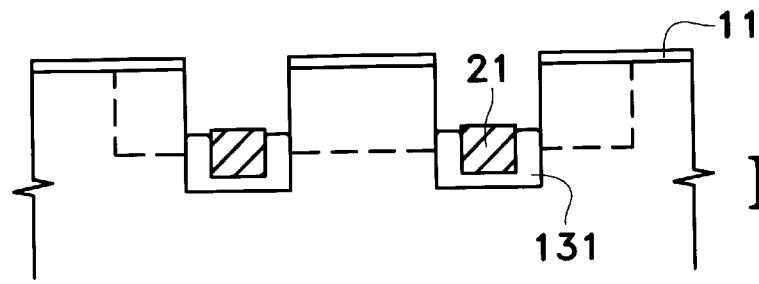

A layer of polycrystalline silicon 21 is then deposited by low pressure chemical vapor deposition of silane to a thickness of approximately 2000 to 4000 Angstroms. By the use of an etching back technique, the polycrystalline silicone layer 21 filled in the source/drain trenches 12 is left to a depth of approximately 0.5 to 2 micrometer, and then a step of wet etching follows for a period of a short time to remove the silicon dioxide layer of the trench walls to form a residual silicon dioxide layer 131, as shown in FIG. 3B.

Figure 3C:
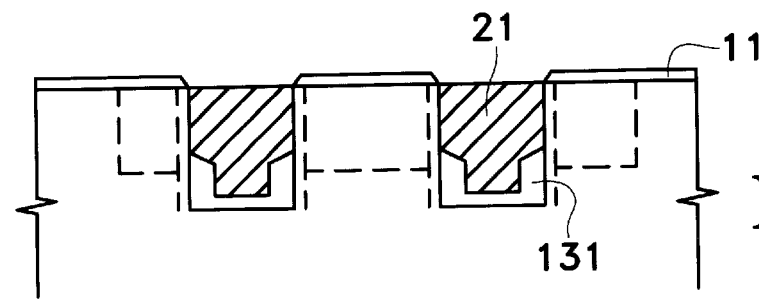

Since some thickness of the pad oxide 11 left during said wet etching to be used as an end point detection for the completeness of the process; the resulting silicon dioxide layer of the trench walls should be thinner than the pad oxide. Additionally, as shown in FIG. 3, a residual silicon dioxide 131 is formed at a bottom of the source/drain trenches 12 to be used as a blocking layer to prevent leakage of a current from the bit lines. Thereafter, a layer of polycrystalline silicon 21 is again deposited to a thickness of approximately 2000 to 4000 Angstroms and is doped by an in situ doping to provide reduction of resistivity and a diffusion source of impurity. In order to form a shallow P-N junction, the polycrystalline silicone layer 21 is doped with BF2 in the case of the N well, or As75 in the case of the P well because of their low diffusivity in silicon. Since, this shallow P-N junction is capable of preventing a punch-through between the bit lines, it provides a greater integration degree. The formation of said shallow P-N junction is proceeded by a drive-in step. Subsequently, the polycrystalline silicon layer 21 is again etched back by reactive ion etching (RIE) while the pad oxide 11 is used as an end point detecting during etching. The resultant structure is shown in FIG. 3C.

Figure 3D:
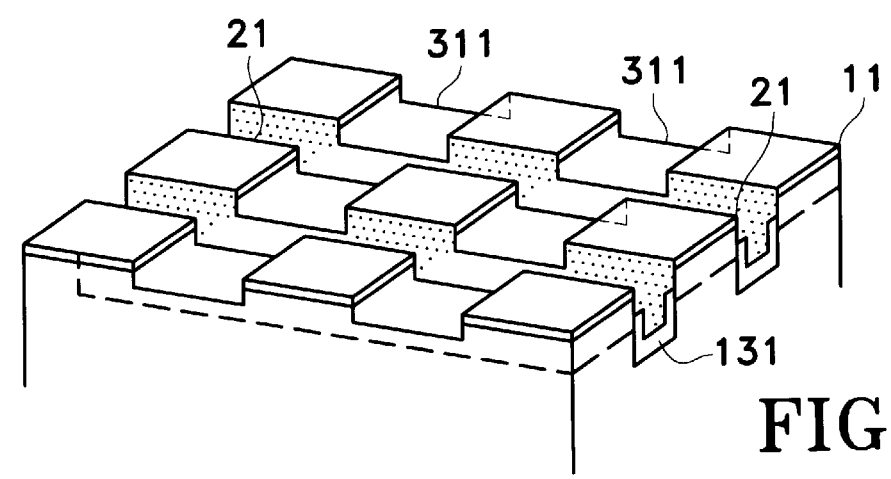

The pad oxide 11 is then removed by wet etching. A layer of photoresist is, in turn, patterned and the polycrystalline silicon layer 21, and the silicon substrate 10, are etched to provide gate trenches 311, as shown in FIG. 3D. The depth of the gate trenches 311 is approximately 0.4 to 1.8 micrometer. It should be mentioned that some distance between a bottom of the gate trenches 311 and a top of the residual silicon dioxide 131, should be preserved to form a channel region.

Figure 3E:
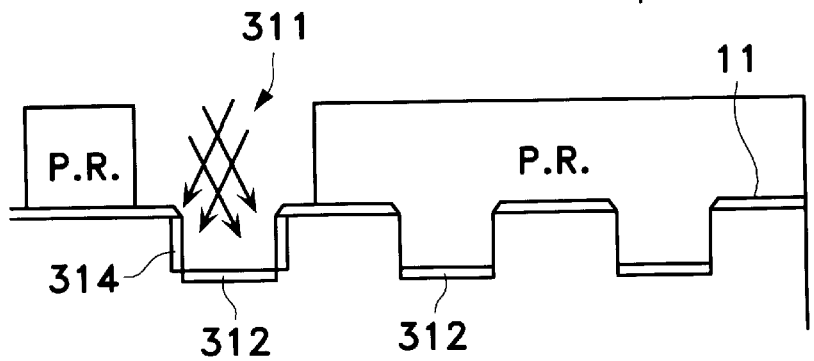
Figure 3F:
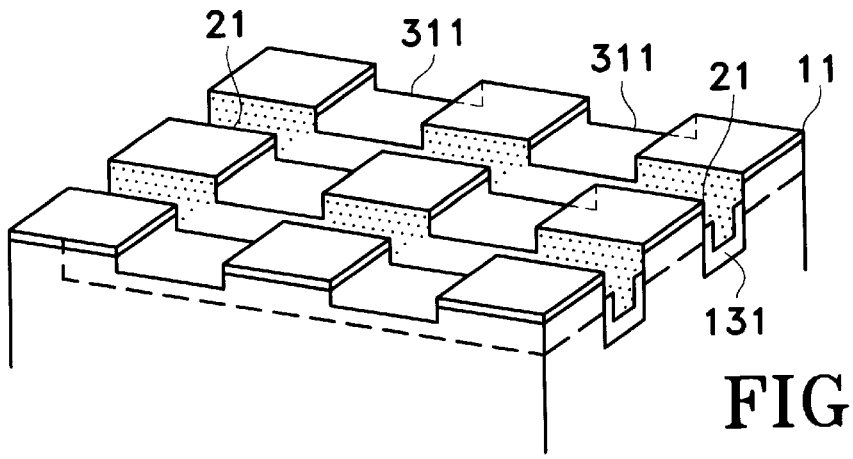
Figure 3G:
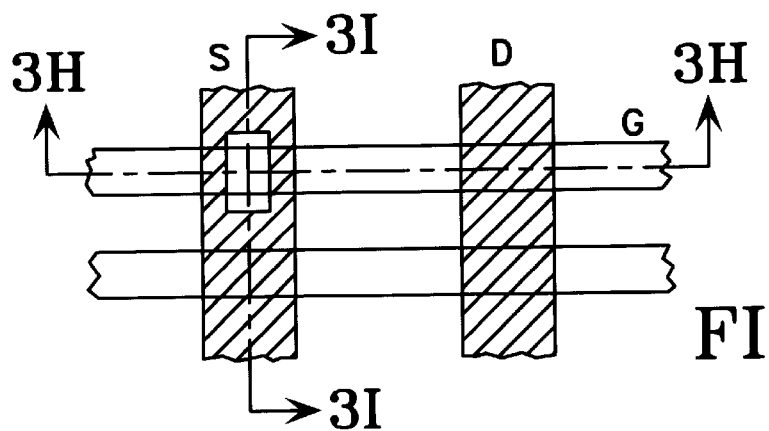
Figure 3H:
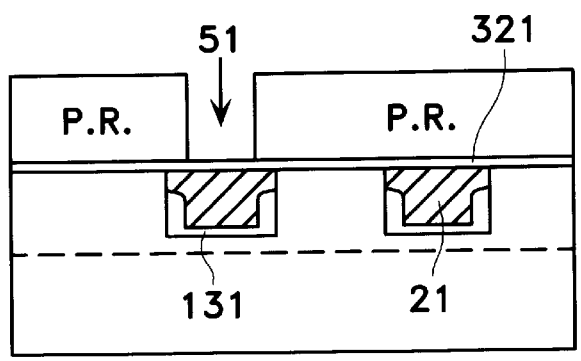
Figure 3I:
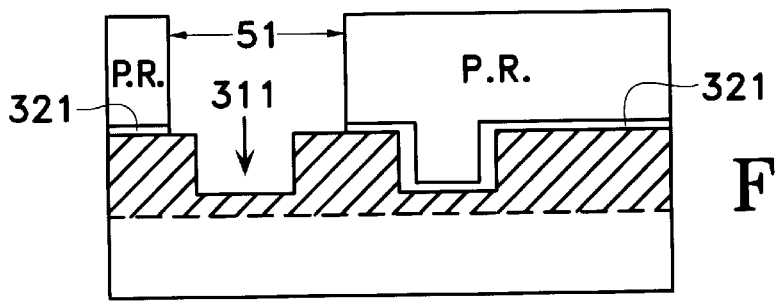
Figure 3J:
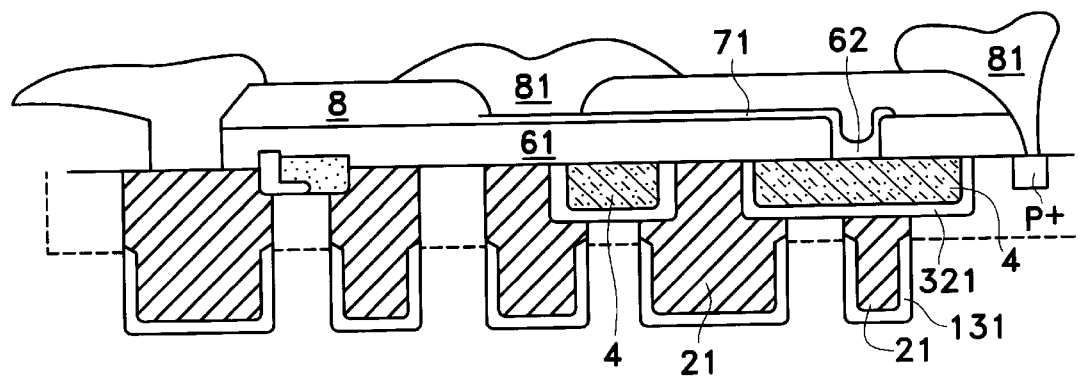

Thereafter, a series of processes controlling the channel width of the pass transistors follows. A SOG (Spin On Glass) insulating layer 312 is deposited to a thickness of approximately 500 to 4000 Angstroms to fill the gate trenches 311, as shown in FIG. 3E. The thickness of the SOG insulating layer 312 is used to control the channel width of the pass transistors. A photoresist layer is then patterned to leave only the pass transistors region exposed; and the resulting entire substrate is, in turn, subject to an ion implantation with an impurity having the same conductivity type as the well region to form a channel stop region 3111. Simultaneously, the SOG insulating layer 312 and its thickness provide an implantation mask for formation of the channel region of the pass transistors at a bottom and corners of the gate trenches 311. The resulting structure is also shown in FIG. 3E. The photoresist layer is then removed using standard photoresist removal processes such as wet removal or ashing. Subsequently, the SOG insulating layer 312 and the pad oxide 11 are simultaneously removed by wet etching. Then, a process of two-step ion implantation is used to adjust the threshold voltage of the pass transistors and the cell transistors. The two-step ion implantation means that the angle of the first step ion implantation is 0°, which is normal to the substrate and the angle of the second-step ion implantation is approximate 15° to 60°, depending on the width and depth of the gate trenches 311. A silicon dioxide layer is then formed by thermal oxidation to a thickness of approximately 80 to 200 Angstroms and used as a gate insulating layer 321 as illustrated in FIG. 3I. In addition, a thicker silicon dioxide layer is simultaneously grown at a surface of the bit-line polycrystalline silicon, because of a higher rate of oxidation of the polycrystalline silicon. The resulting structure is shown in FIG. 3F.

Figure 1:
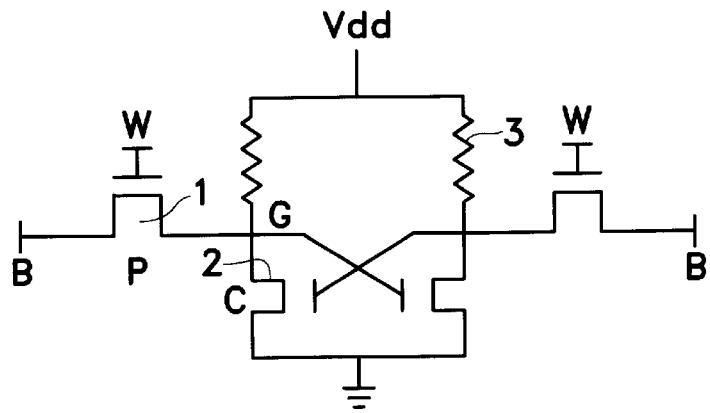
FIG. 1 is a 4T (Transistor) SRAM cell.

A layer of photoresist is then patterned and the gate insulating layer 321 is etched to provide a buried contact 51, designated G point shown is FIG. 1. FIG. 3H is a cross-sectional view along 3H—3H line of FIG. 3G, wherein the buried contact 51 is the region where the bit lines (i.e. the first polycrystalline silicon) and a polyresistor can be connected. Besides, FIG. 3I is a cross-sectional view along 3I—3I line of FIG. 3G.

Referring now to FIG. 3H, the following processes are described. After the removal of the photoresist layer, a second polycrystalline silicon layer is deposited to a thickness of over-flowing the gate trenches 311 and is doped by in situ doping with phosphorus impurity for a N MOSFET, or with Boron impurity for a P MOSFET. Using the silicon dioxide located at a top surface of the substrate 10, as the end point detection, the second poly crystalline silicon layer is etched back to form a gate electrode 4 of the MOSFET. An inter-poly insulating film 61 is then deposited by chemical vapor deposition to provide electrical insulating between the two polycrystalline silicon layer; a layer of photoresist is, in turn, patterned to provide an vias 62 connecting the gate electrode 4 and the poly-load. Over the entire exposed substrate a third polycrystalline silicon layer 71 is deposited and, in turn, subject to photoing and etching to form the poly-load of the SRAM cells, designated 3, as shown in FIG. 1. The remaining processes are conventional back-end CMOS processes; that is, a sequential process of depositing, photoing, and etching of an insulating layer 8, a metal layer 81, and a passivation layer respectively. The resulting structure is shown in FIG. 3H.

Figure 4:
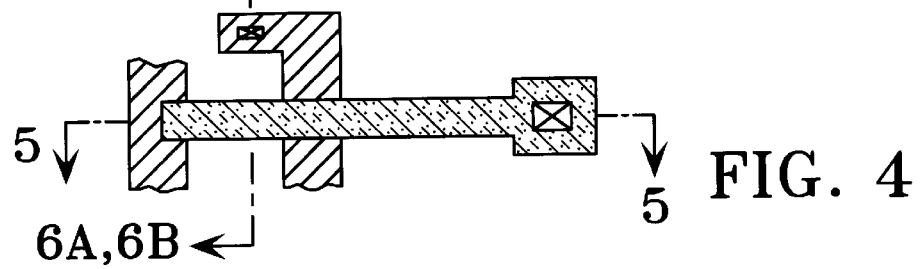
FIG. 4 is a lay out of a MOSFET manufactured according to the present invention.
Figure 5:
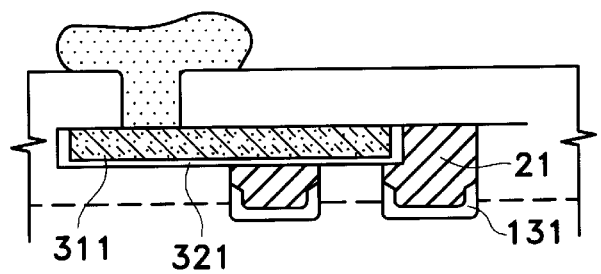
FIG. 5 is a cross-sectional view from the 5—5 line of FIG. 4.

With reference now to FIG. 4, there is shown a lay-out of a MOSFET and it may be a pass transistor or a cell transistor in the present invention. The source/drain regions (bit lines) and the gate regions (word lines) are shown by singledeclined lines and double declined lines respectively. FIG. 5 shows a cross-sectional view from the H-3H line of FIG. 4. As shown, there is a suitable distance between the gate insulating layer 321 and the residual silicon dioxide 131 to provide the formation of the channel region. Otherwise, when an inversion layer occurs beneath the gate insulating layer 321, a carrier will be blocked by the residual silicon dioxide 131 and can't reach the source/drain regions, consequently, the MOSFET would lose its function. Moreover, the source and drain regions (the bit lines) are formed by the first polycrystalline silicon 21, which is notably different from the diffusion region disclosed in the prior art. The present invention therefore provides a novel MOSFET capable of forming the shallow junction due to the low diffusivity of impurity doped in the first polycrystalline silicon 21. The formation of which enables a greater packing density for the present invention. In addition, since most the source/drain regions are surrounded by a layer of residual silicon dioxide 131 to prevent current leakage, it results in the raising of the punch-through voltage.

Figure 6A:
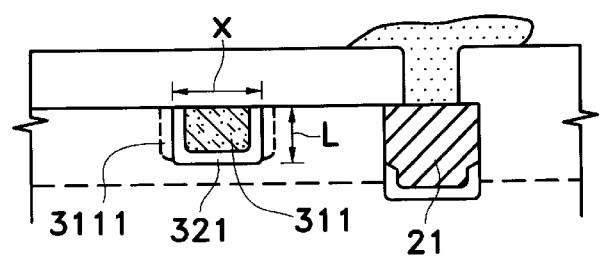
FIG. 6A is a cross-sectional view from the 6A, 6B-6A, 6B line of FIG. 4, wherein the MOSFET is used as a pass transistor.
Figure 6B:
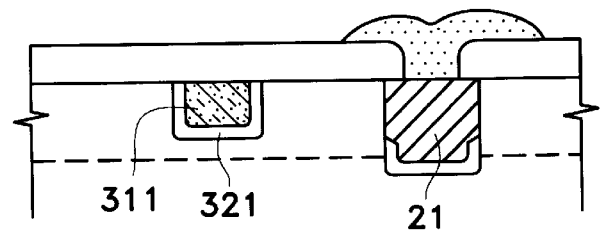
FIG. 6B is a cross-sectional view from the 6A, 6B-6A, 6B line of FIG. 4, wherein the MOSFET is used as a cell transistor.

FIG. 6A is a cross-sectional view from the 6A, 6B-6A, 6B line of FIG. 4; wherein the MOSFET is used as a pass transistor of the SRAM cells. It should be mentioned that the carrier will only pass the bottom of the gate trenches 311. Referring now to FIG. 6A, assuming that the depth and width of the gate trenches 311 have a L and X value respectively. The effective channel width of the pass transistor would be restricted to the X value by the channel stop region 3111. In the other cases, shown in FIG. 6B in which the MOSFET is used as a cell transistor, the effective channel width of the cell transistor would be 2L+X value and its shape is like an U type, due to lack of the channel stop region 3111 at a side-wall of the gate trenches 311. It is therefore evident that the channel width of the cell transistor or the pass transistor and their ratio (i.e. cell ratio) can be easily controlled according to the invention without needing extra area, thereby increasing the stability of the data stores in the cell transistor. In other words, the data can be read from the SRAM cells more stable without a possibility of being distorted.

Figure 2A:
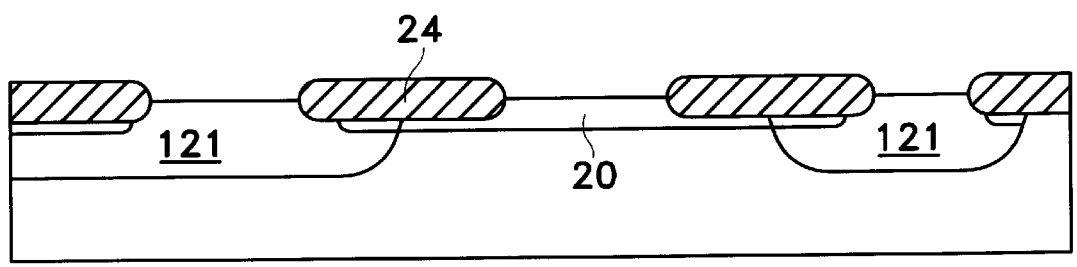
FIGS. 2A through 2C are schematic cross-sectional views of several crucial steps in a conventional 64K SRAM CMOS process.
Figure 2B:
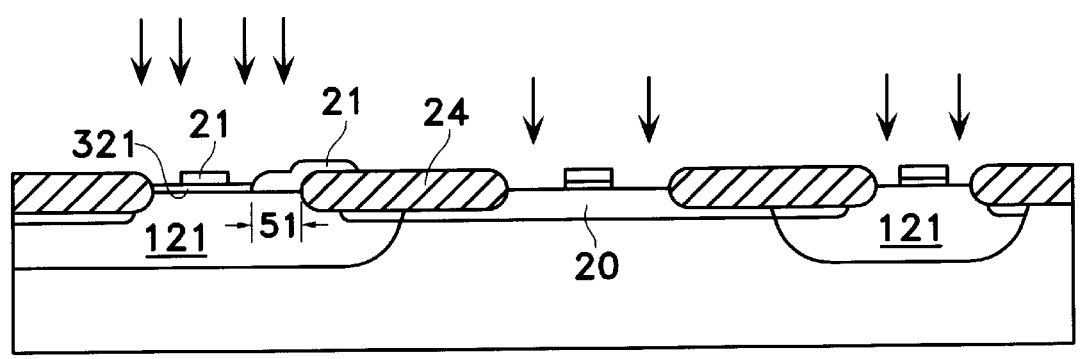
Figure 2C:
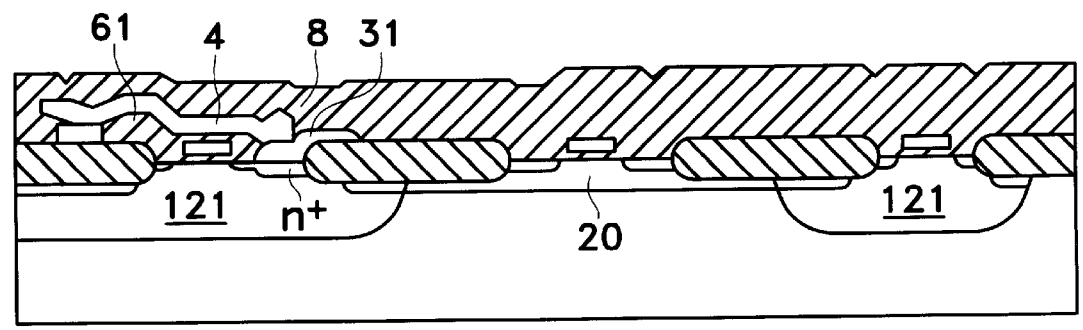

Beside the several advantages disclosed above, compared with the prior art, there are other advantageous features of the invention as listed below. (1) There remains a self-aligned buried gate structure, because some of the first polycrystalline silicon 21 (i.e. the source/drain regions) is etched to provide a part of the gate trenches 311 and the depth of the gate trenches is much more shallow than that of the source/drain regions, as evident from FIG. 5. Thus, the invention also reserves a high cell density of a self-aligned process due to no aliment tolerances between the gate and source/drain regions. (2) The SRAM cells according to the invention have more planar topography due to the buried source/drain regions and the gate regions. Since the prior art, as shown in FIG. 2C, has a more complex topography, the accuracy of exposure and developing of photoresist, especially at a recessed region, is not easily controlled due to the limited resolution of photolithography. The present invention has eliminated the above-mentioned problem and, therefore, has increased the integration degree. (3) There is no field oxide between active regions. Unlike the prior art in which the field oxide was used as filed isolation, the invention uses a blank ion implantation for raising the punch-through voltage as field isolation. The improvement has eliminated the problems of bird's beak encroachment frequently encountered in the prior art thereby providing a greater packing density.

Although the preferred embodiment of the invention has been disclosed for illustrative purposes, those skilled in the art will appreciate that various modifications, additions and substitutions are possible, without departing from the scope and spirit of the invention, as disclosed in the accompanying claims.

We claim:

1. A buried structure SRAM device comprising:

a substrate of a first conductivity type having a well region of a second conductivity type;

source/drain trenches located in said well region, said source/drain trenches being filled with a residual silicon dioxide layer and then with a highly doped first polyecrystalline silicon layer to form a source/drain region of a transistor, wherein said first polycrystalline silicon layer having impurities of a first conductivity type to form a shallow junction by diffusion; gate trenches also located in said well region wherein said gate trenches having a channel stop region only in a side-wall region of a pass transistor to define an effective channel width of said pass transistor formed at a bottom of said gate trenches as compared to an U shape effective channel width of a cell transistor formed at side-walls and a bottom of said gate trenches; the gate trenches being implanted with threshold voltage-adjusted ions, and filled with a gate oxide and a highly doped second polycrystalline silicon to form a gate electrode of the transistor;

an inter-poly insulating layer deposited between said highly doped first and second polycrystalline silicon to provide electric insulation; and a poly-load formed by depositing and patterning of a third polycrystalline silicon layer.

2. A device according to claim 1 wherein the first polycrystalline silicon is preferably doped with $BF_2$ in case of a N well, or $As_{75}$ in case of a P well, to form a shallow junction because of their low diffusivity in silicon.

3. A device according to claim 1 wherein a predetermined distance between the gate oxide and the residual silicon dioxide layer is provided for formation of the channel region.

4. A device according to claim 1 further comprising:

an insulating layer, such as B.P.S.G, over said poly load;

contact holes formed by patterning of said insulating layer;

a metal layer over said insulating layer; and a passivation layer over said metal layer.

* * * * *